United States Patent
Takada (10) Patent No.: US 7,102,730 B2
(45) Date of Patent: Sep. 5, 2006

(54) EXPOSURE DEVICE

(75) Inventor: Norihisa Takada, Kanagawa (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 163 days.

(21) Appl. No.: 10/807,310

(22) Filed: Mar. 24, 2004

(65) Prior Publication Data

US 2004/0189970 A1 Sep. 30, 2004

(30) Foreign Application Priority Data

Mar. 25, 2003 (JP) ............................ 2003-083608

(51) Int. Cl.
*G03B 27/42* (2006.01)

(52) U.S. Cl. ........................ 355/53; 355/67; 250/548; 356/400

(58) Field of Classification Search ................... None
See application file for complete search history.

(56) References Cited

U.S. PATENT DOCUMENTS 6,628,390 B1* 9/2003 Johnson ...................... 356/400
2005/0041229 A1* 2/2005 Meisburger .................. 355/53

* cited by examiner

*Primary Examiner*—D. Rutledge
(74) *Attorney, Agent, or Firm*—Sughrue Mion, PLLC (57) ABSTRACT

A light beam emitted from a light source passes through a spatial light modulation device, at which a plurality of unit elements for respectively modulating incident light beam are two-dimensionally arrayed, and a microlens array, at which a plurality of microlenses corresponding to the unit elements are arrayed, and is focused on an exposure surface. A four-part detector, which is structured by four diodes, is disposed on the exposure surface so as to correspond to four pixels which are present at one corner of the exposure area. Relative mispositioning between the spatial light modulation device and the microlens array generates a difference in respective detection signals of the four diodes. Thus, an offset between the spatial light modulation device and the microlenses can be detected. Positional adjustment of the microlens array is performed on the basis of a detected offset amount.

19 Claims, 9 Drawing Sheets

EXPOSURE DEVICE

CROSS-REFERENCE TO RELATED APPLICATION

This application claims priority under 35 USC 119 from Japanese Patent Application No. 2003-83608, the disclosure of which is incorporated by reference herein.

BACKGROUND OF THE INVENTION

1. Field of the Invention

The present invention relates to an exposure device, and particularly to an exposure device which exposes a photosensitive material with a light beam which is modulated by a spatial light modulation device in accordance with image data.

2. Description of the Related Art

Heretofore, various exposure devices have been proposed which carry out image exposure with light beams which have been modulated, using spatial light modulation devices, in accordance with image data, such as, for example, exposure devices for photo masks which are employed in liquid crystal fabrication devices, exposure devices for printing plate fabrication and the like.

Figure 9A:
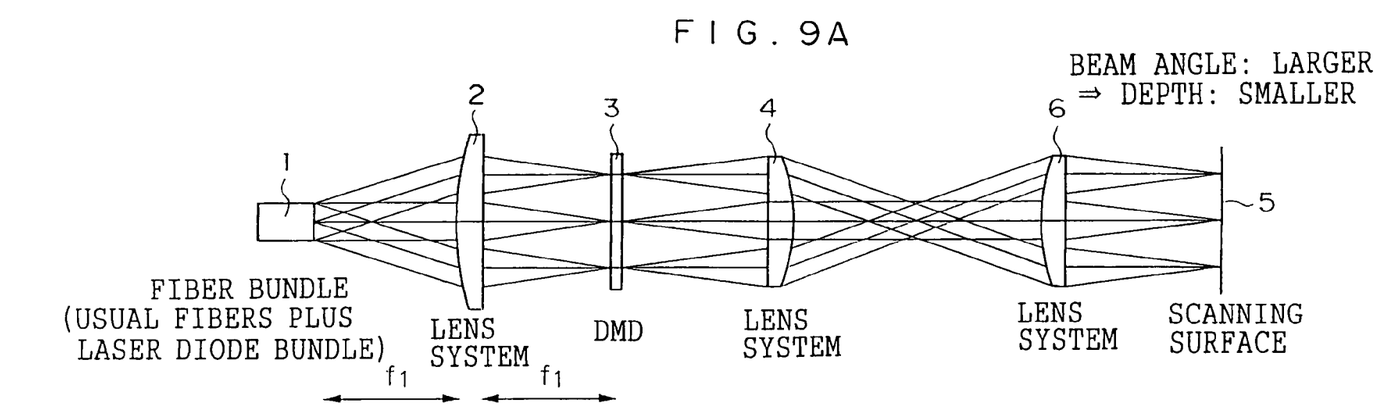
FIG. 9A is a side view showing structure of a conventional exposure head along an optical axis thereof.

An exposure device which uses a digital micromirror device (DMD) as a spatial light modulation device has been structured by, for example, a light source 1, a lens system 2, a DMD 3 and lens systems 4 and 6, as shown in FIG. 9A. The light source 1 irradiates laser light. The lens system 2 collimates the laser light irradiated from the light source 1. The DMD 3 is disposed substantially at a focusing position of the lens system 2. The lens systems 4 and 6 focus the laser light, which has been reflected from the DMD 3, onto a scanning surface 5. The DMD is a mirror device in which numerous micromirrors, which alter angles of reflection surfaces thereof in accordance with control signals, are arranged two-dimensionally on a semiconductor support of silicon or the like. In this exposure device, the laser light is modulated by ON-OFF control of each of the micromirrors of the DMD 3 from an unillustrated control apparatus, by control signals which are generated in accordance with image data or the like, and image exposure is carried out with the modulated laser light. Note that FIG. 9A is an unfolded schematic view along an optical axis.

Figure 9B:
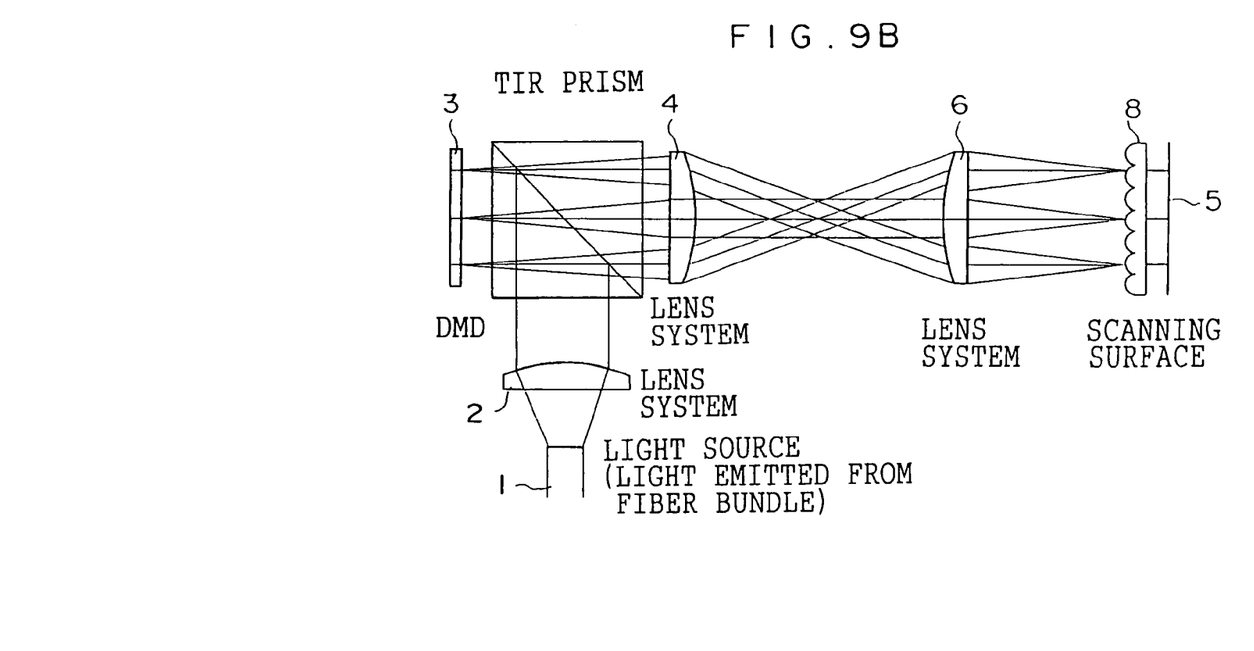
FIG. 9B is a side view showing structure of a conventional exposure head along an optical axis thereof.

In such an exposure device, for example, with the goal of reducing spot diameter and raising resolution, a microlens array (MLA) 8 may be disposed so as to correspond with an image of the DMD 3, as shown in FIG. 9B, and image exposure with a high resolution may be carried out. Note that, in FIG. 9B, the laser light that has been irradiated from the light source 1 and collimated at the lens system 2 is reflected at a total internal reflection (TIR) prism and illuminated to the DMD 3. Further, the laser light that has been reflected at the DMD 3 passes through the TIR prism and is incident at the lens system 4.

However, in an exposure device which is equipped with a confocal optical system which condenses light reflected from a DMD by lenses of a microlens array (MLA), passes the light through apertures and focuses the light, even if optical axis adjustment is carried out at a time of assembly, relative mispositioning between structural members arises because of thermal expansion, chronological development of residual stresses in the structural members and the like, and there is a problem in that images on the DMD are not accurately projected to a focusing plane. Further, as a result thereof, there are problems in the exposure device in that utilization efficiency of light falls, focusing positions are shifted, and light spills over into neighboring pixels and causes a deterioration in resolution.

SUMMARY OF THE INVENTION

The present invention has been devised in order to solve problems with the conventional technology described above, and an object of the present invention is to provide an exposure device which can accurately project an image of a spatial light modulation device at a focusing plane.

In order to achieve the object described above, an exposure device of a first aspect of the present invention includes: a light source which emits a light beam for exposure; a spatial light modulation device at which a plurality of modulation elements, which respectively change light modulation states thereof in accordance with control signals, are two-dimensionally arranged, the spatial light modulation device being for modulating the light beam, which is incident at the plurality of modulation elements from the light source, at each of the modulation elements; a microlens array at which a plurality of microlenses are two-dimensionally arranged with a pitch corresponding to the plurality of modulation elements, the microlens array being for condensing light beams, which have been modulated by the modulation elements, at the respective microlenses; a shift amount detection section for detecting an offset amount of relative positions of the light beams which have been modulated by the modulation elements and the corresponding microlenses; and a position adjustment section which finely adjusts position of at least one of the spatial light modulation device and the microlens array on the basis of the detected offset amount.

In the exposure device of the aspect of the present invention described above, the light beam that is incident at the spatial light modulation device from the light source is modulated by the modulation elements of the spatial light modulation device, and the light beams that have been modulated are condensed at the respective microlenses of the microlens array. At this time, relative mispositioning between the spatial light modulation device and the microlens array occurs because of thermal expansion, chronological development of residual stresses and the like. Accordingly, an offset amount of relative positions of the light beams that have been modulated by the respective modulation elements of the spatial light modulation device and the corresponding microlenses is detected by the shift amount detection section. Hence, the position of the at least one of the spatial light modulation device and the microlens array is finely adjusted by the position adjustment section on the basis of the detected offset amount. Thus, the light beams that have been modulated by the respective modulation elements are properly incident at the corresponding microlenses, and an image of the spatial light modulation device is accurately projected at the focusing plane.

In the exposure device described above, it is preferable if the position adjustment section finely adjusts the position of the at least one of the spatial light modulation device and the microlens array, on the basis of the detected offset amount, such that the offset amount is reduced. More specifically, it is preferable to finely adjust the position of the at least one of the spatial light modulation device and the microlens array such that the offset amount of the relative positions of the light beams modulated by the modulation elements and the corresponding microlenses, which is detected at the shift amount detection section, is not more than a predetermined amount.

Further, in the exposure device described above, a focusing optical system may be provided which focuses the light beams that have been modulated by the modulation elements so as to correspond with the microlenses. In a case in which such a focusing optical system is provided, the position of at least one of the spatial light modulation device, the microlens array and an optical member which structures the focusing optical system is finely adjusted. Of these structural members, if a position of a member whose sensitivity with respect to optical axis shifting is lower is adjusted, optical axis adjustment is easier.

In this case too, it is preferable if the position adjustment section finely adjusts the position of the at least one of the spatial light modulation device, the microlens array and the optical member structuring the focusing optical system, on the basis of the detected offset amount, such that the offset amount is reduced. More specifically, it is preferable to finely adjust the position of the at least one of the spatial light modulation device, the microlens array and the optical member structuring the focusing optical system such that the offset amount of the relative positions of the light beams modulated by the modulation elements and the corresponding microlenses, which is detected at the shift amount detection section, is not more than a predetermined amount.

Further, a shift amount detection section which includes a plurality of light detection elements, which correspond, respectively, to a mutually adjacent plurality of the modulation elements, and a calculation section, which calculates the offset amount of the light beams which have been modulated by the modulation elements and the corresponding microlenses on the basis of detection signals from the plurality of light detection elements, can be used as the shift amount detection section. As the light detection elements, beside photodiodes, phototransistors, a CCD (charge coupled device) or the like can be employed.

For example, a four-part (fourfold) detector may be employed which includes four photodiodes, which correspond, respectively, to four of the modulation elements which are arranged in a matrix form, and a calculation section which calculates, on the basis of detection signals from the four photodiodes, a row direction offset amount and a column direction offset amount of the light beams modulated by these modulation elements and the corresponding microlenses.

Further still, a trimming mechanism which utilizes piezoelectric elements may be employed as the position adjustment section.

An exposure device of one other aspect of the present invention includes: a light source which emits a light beam; a spatial light modulation device including a plurality of unit elements which are arranged two-dimensionally, the spatial light modulation device being for modulating the light beam, which is incident at the plurality of unit elements, at each of the unit elements in accordance with control signals which are inputted to the spatial light modulation device; a microlens array including microlenses which are arranged to correspond to the plurality of unit elements and which respectively condense light beams, which have been modulated by the unit elements; a displacement detection section for detecting displacement of a relative position of at least one of the plurality of unit elements and at least one of the plurality of microlenses corresponding to the at least one unit element from a predetermined relative position; and a position adjustment section which finely adjusts position of at least one of the spatial light modulation device and the microlens array on the basis of the detected displacement.

DETAILED DESCRIPTION OF THE INVENTION

Below, details of an embodiment of the present invention will be described with reference to the drawings.

Structure of Exposure Device

Figure 1:
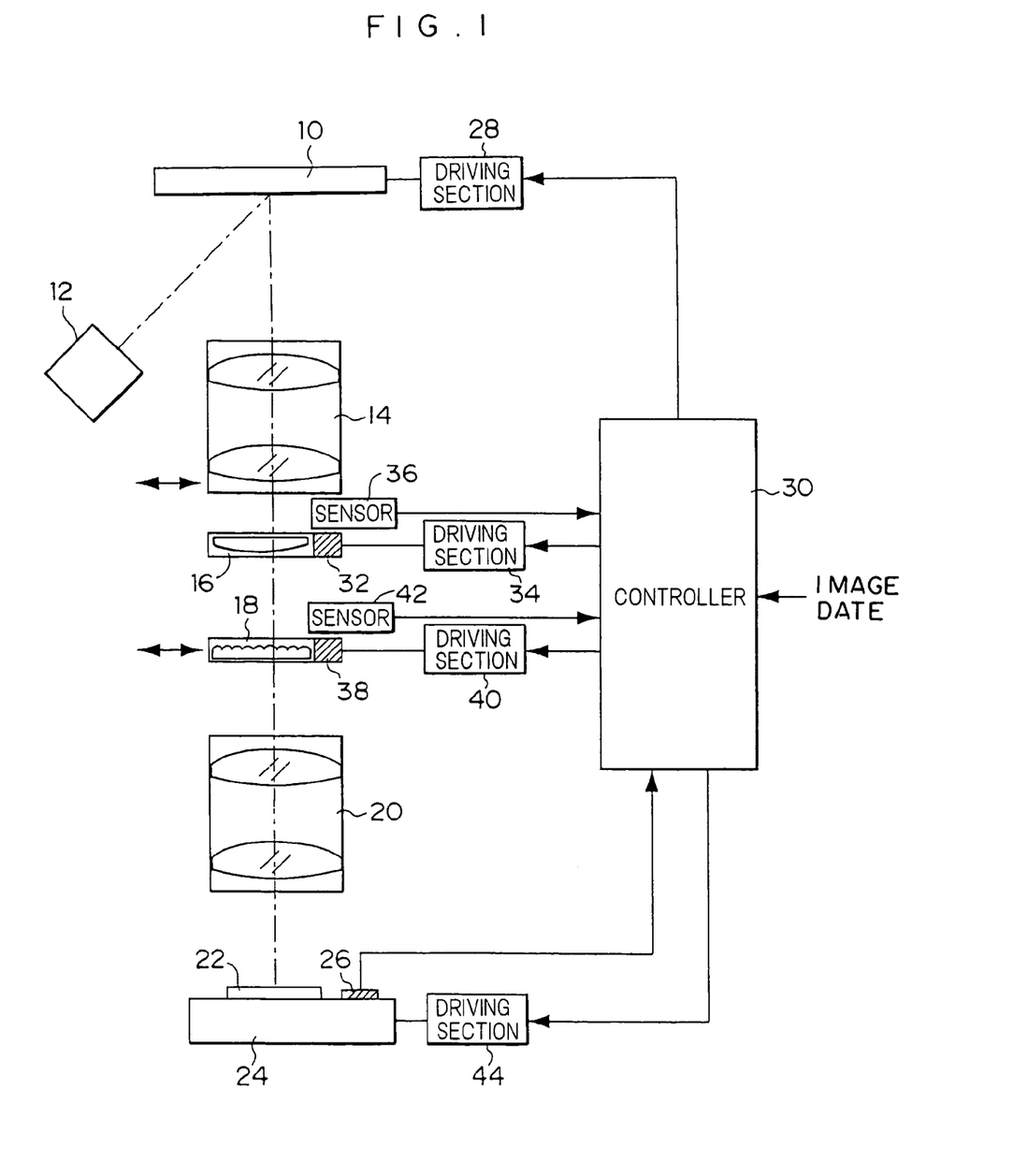
FIG. 1 is a schematic view showing structure of an exposure device of a present embodiment.

As shown in FIG. 1, the exposure device relating to the present embodiment is equipped with a digital micromirror device (DMD) 10, which serves as a spatial light modulation device for modulating an incident light beam at each of pixels in accordance with image data. A light source 12, which illuminates the DMD 10, is disposed at a light incidence side of the DMD 10. Meanwhile, at a light reflection side of the DMD 10, an enlargement lens system 14 and a magnification adjustment lens 16 are disposed in that order from an upstream side. The enlargement lens system 14 enlarges a DMD image which has been reflected from the DMD 10, and the magnification adjustment lens 16 adjusts a focusing magnification.

A microlens array 18 is disposed at a position at which the DMD image is focused by the magnification adjustment lens 16. Microlenses thereof are distributed to correspond to respective modulation elements of the DMD 10. A focusing lens system 20 is disposed at a light emission side of the microlens array 18 such that the DMD 10 and an exposure surface have a conjugative relationship.

A stage 24, on which a light-sensitive member 22 is placed, is disposed at a light emission side of the focusing lens system 20. The stage 24 is structured to be movable in three directions, an X direction, a Y direction, and a Z direction which intersects an X-Y plane. A four-part detector 26 is disposed on the stage 24, at the same height as an exposure surface of the light-sensitive member 22.

The DMD 10 is connected to a controller 30 via a driving section 28, which drives the respective micromirrors. The controller 30 is constituted by a computer which is equipped with a CPU, ROM, RAM, memory, input/output devices such as a monitor, a keyboard and the like, and the like.

A trimming mechanism 32, which utilizes piezoelectric elements, is mounted at the magnification adjustment lens 16. This trimming mechanism 32 is connected to the controller 30 via a driving section 34. A position detection sensor 36, which detects position of the magnification adjustment lens 16, is disposed in a vicinity of the magnification adjustment lens 16. The trimming mechanism 32 finely adjusts the position of the magnification adjustment lens 16 in the X and Y directions on the basis of detection signals from the position detection sensor 36.

A trimming mechanism 38 which utilizes piezoelectric elements is mounted at the microlens array 18, similarly to the magnification adjustment lens 16. This trimming mechanism 38 is connected to the controller 30 via a driving section 40. A position detection sensor 42, which detects position of the microlens array 18, is disposed in a vicinity of the microlens array 18. The trimming mechanism 38 finely adjusts the position of the microlens array 18 in the X and Y directions on the basis of detection signals from the position detection sensor 42.

Here, it is required that the modulation elements of the DMD 10 and the microlenses of the microlens array 18 have a one-to-one correspondence, and a magnification rate of the enlargement lens system 14 is specified such that pixel pitches of the modulation elements and the microlenses coincide. However, the magnification rate of this lens will have an error of 1 or 2%, due to irregularities in curvatures of the lens, inter-surface spacings and refraction rates, and the like. Because the magnification adjustment lens 16 is disposed in addition to the enlargement lens system 14, a spacing between the enlargement lens system 14 and the magnification adjustment lens 16 can be adjusted. Thus, errors due to lens magnification rates can be corrected for, and a lens magnification rate can be adjusted to accord with a design value.

The stage 24 is connected to the controller 30 via a driving section 44. This driving section 44 drives the stage 24 in accordance with control signals from the controller 30. The four-part detector 26 disposed on the stage 24 is also connected to the controller 30, and detection signals from the four-part detector 26 are inputted to the controller 30.

Next, an exposure operation of the exposure device shown in FIG. 1 will be described. When image data is inputted to the controller 30, the controller 30 generates control signals to control driving of the micromirrors of the DMD 10, based on the inputted image data. On the basis of these control signals, the driving section 28 changes angles of reflection surfaces of the micromirrors of the DMD 10.

Illumination light that is irradiated at the DMD 10 from the light source 12 is reflected in predetermined directions in accordance with the angles of the reflection surfaces of the micromirrors, and is thus modulated. The modulated light is enlarged by the enlargement lens system 14. Accordingly, a size of pixel spots of the DMD 10 on the exposure surface is enlarged, and a pitch of the pixel spots is also enlarged.

A focusing magnification rate of the light that has been enlarged by the enlargement lens system 14 is finely adjusted by the magnification adjustment lens 16. The light whose magnification rate has been thus adjusted is incident at the respective microlenses provided at the microlens array 18, and the enlarged DMD images are contracted again. Here, all flux of the light is incident on the microlens array 18. The light that has been condensed at the microlens array 18 is incident at the focusing lens system 20, and an image of the DMD 10 is focused on the exposure surface of the light-sensitive member 22 by the focusing lens system 20.

Four-Part Detector

Figure 2A:
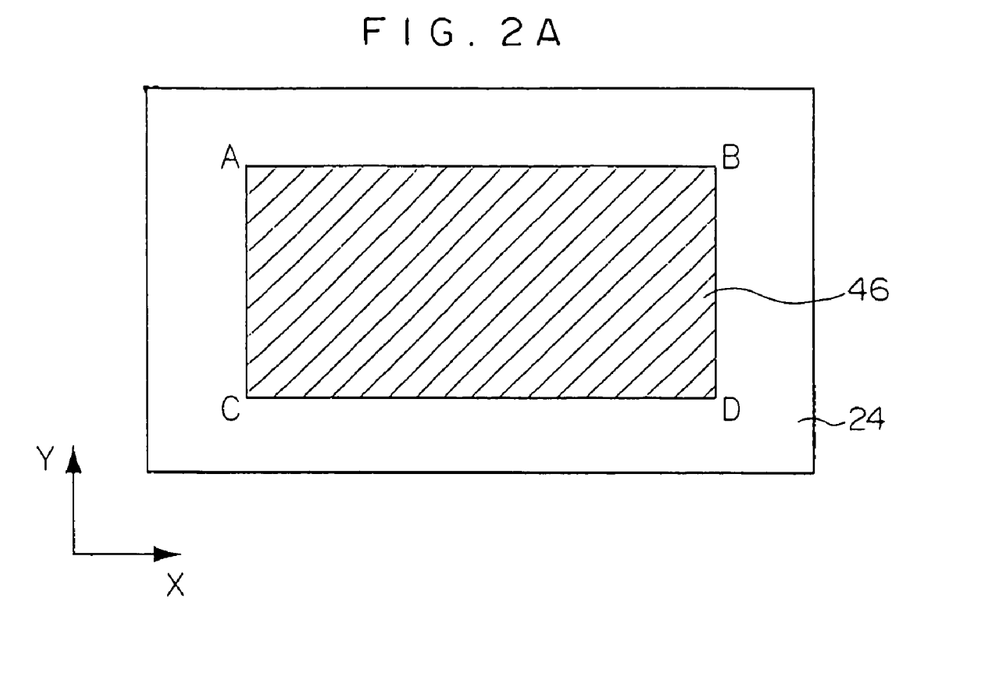
FIG. 2A is a plan view showing an exposure area formed on a stage.

When the stage 24 is disposed at a reference position, the four-part (fourfold) detector 26 is disposed at at least one of four corners A, B. C and D of a rectangular exposure area 46 which is formed on the stage 24, as shown in FIG. 2A. The exposure area 46 is constituted by a large number of pixels, which correspond to the respective modulation elements of the DMD 10.

Figure 2B:
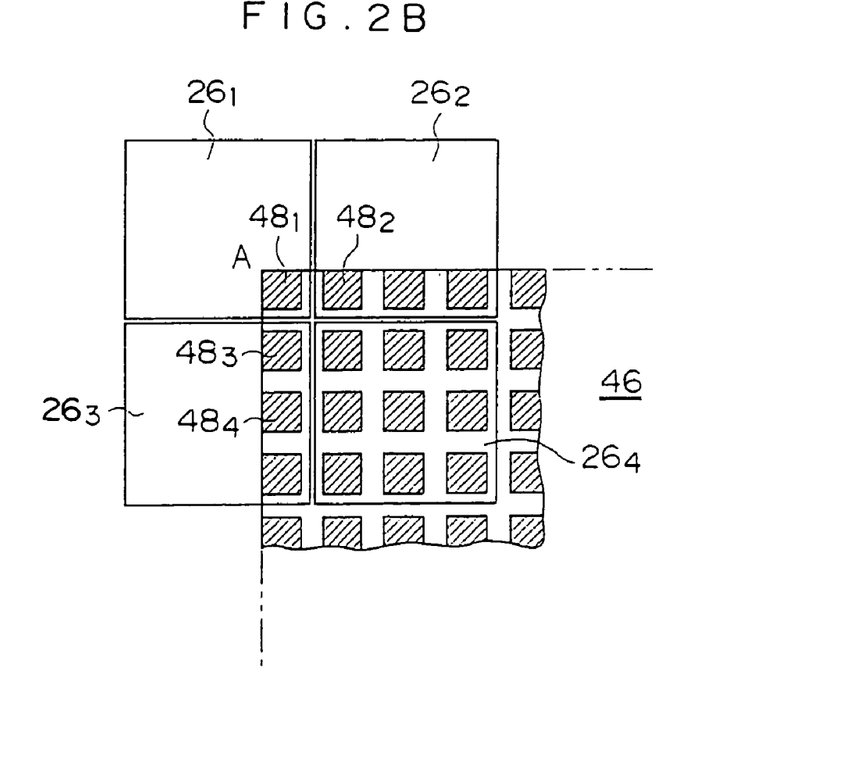
FIG. 2B is a plan view showing an arrangement of a four-part detector.

For example, as shown in FIG. 2B, in a case in which the four-part detector 26 is disposed at corner A, the four-part detector 26 is disposed such that four pixels $48_1$, $48_2$, $48_3$ and $48_4$ correspond to four diodes $26_1$, $26_2$, $26_3$ and $26_4$, respectively, of the four-part detector 26. The four pixels $48_1$, $48_2$, $48_3$ and $48_4$ (which are pixels of exposed images) are present at corner A of the exposure area 46 and are mutually adjacent.

With a four-part detector with a size of around 1.5 mm by 2.0 mm, if a spacing between neighboring diodes is approximately 15 μm and a spacing between neighboring pixels of an exposed image is approximately 70 μm, then it is possible for the four-part detector 26 to be disposed with a positional accuracy with respect to the four pixels of ±20 μm.

Figure 3A:
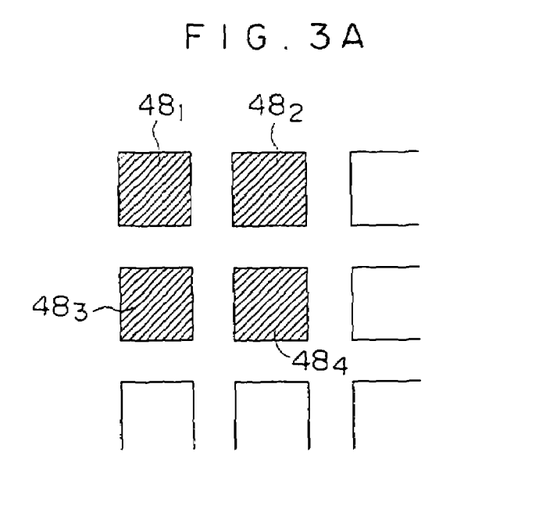
FIG. 3A is a diagram showing four pixels which light up during detection of mispositioning.

Next, a method for using the four-part detector 26 to detect relative mispositioning of the DMD 10 and the microlens array 18 will be described. First, as shown in FIG. 3A, the four modulation elements of the DMD 10 that correspond to the four pixels $48_1$, $48_2$, $48_3$ and $48_4$ which are present at corner A of the exposure area 46 are lit up. That is, the modulation elements modulate the light beam such that those four pixels could be exposed.

Figure 3B:
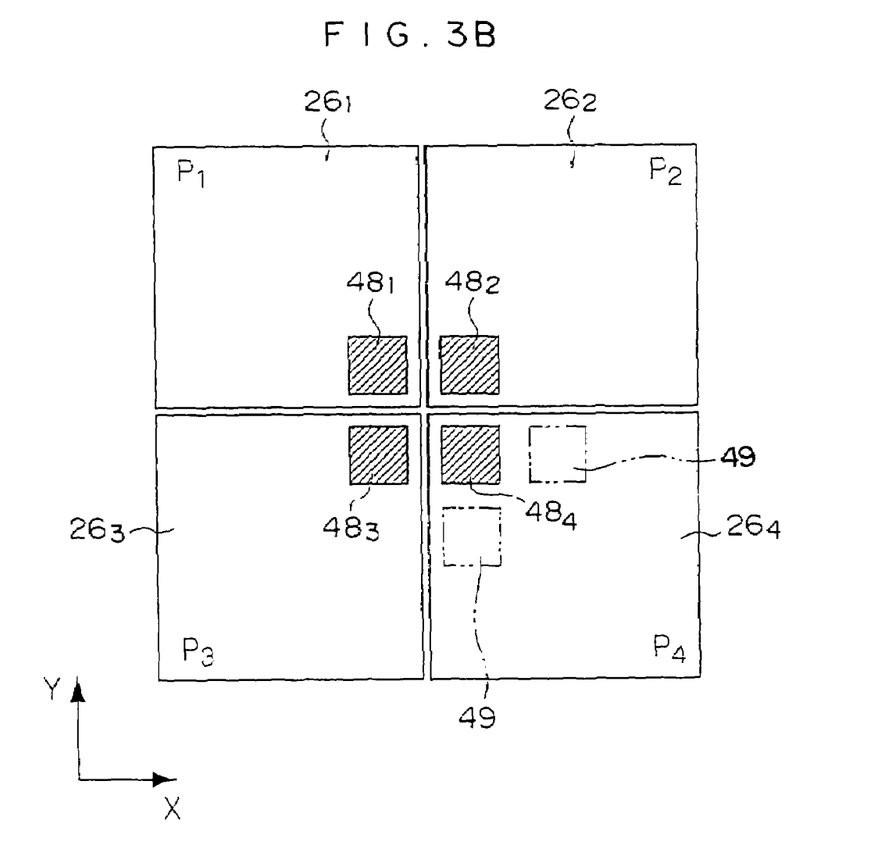
FIG. 3B is an explanatory view of a procedure for detecting mispositioning with the four-part detector.

As shown in FIG. 3B, if output signals of the four diodes $26_1$, $26_2$, $26_3$ and $26_4$ corresponding to the four pixels are, respectively, $P_1$, $P_2$, $P_3$ and $P_4$, then, in a case in which there is relative mispositioning between the DMD 10 and the microlens array 18, values of the output signals $P_1$, $P_2$, $P_3$ and $P_4$ will be out of balance. For example, in this example only the value of $P_4$ is large.

Figure 4A:
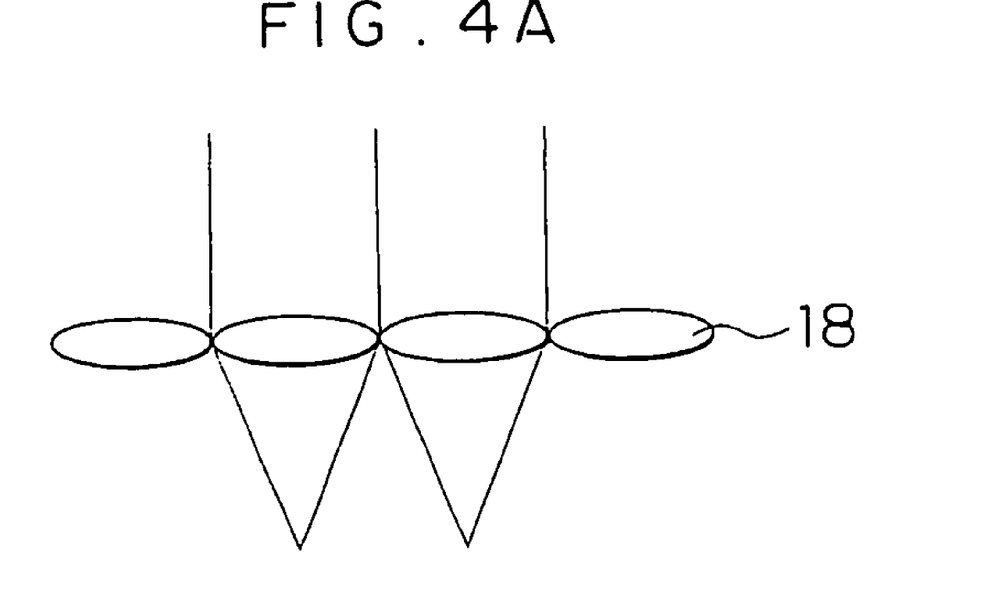
FIG. 4A is a diagram showing a situation in which modulation elements of a DMD conform with positions of microlenses of a microlens array.
Figure 4B:
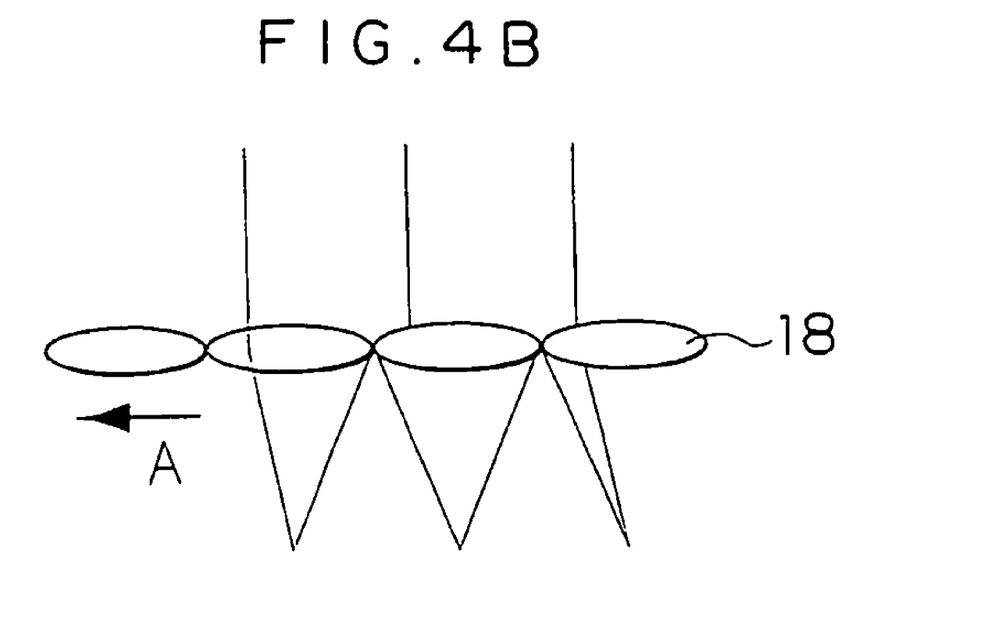
FIG. 4B is a diagram showing a situation in which the modulation elements of the DMD do not conform with the positions of the microlenses of the microlens array.

Factors which cause imbalances will be briefly described. In a case in which, as shown in FIG. 4A, the light beams that are modulated by the modulation elements of the DMD 10 coincide with the positions of the corresponding microlenses of the microlens array 18, the beams that are incident on the microlenses will be focused at predetermined positions of the exposure surface. In contrast, if, as shown in FIG. 4B, the microlens array 18 is offset in the direction of arrow A, portions of beams corresponding to neighboring modulation elements of the DMD 10 will be incident at neighboring microlenses, and will be focused at positions which are separated from the predetermined positions. For example, in the example of FIG. 3B, light that should be focused as pixel $48_4$ is focused as noise 49 at positions of the diode $26_4$ which differ from the pixel $48_4$.

As described above, in a case in which there is relative mispositioning between the DMD 10 and the microlens array 18, a difference is generated between the output signals $P_1$, $P_2$, $P_3$ and $P_4$ of the four-part detector 26, and the occurrence of an error (offset) can be detected. That is, an offset in relative positions of the light beams reflected at the micromirrors (modulation elements) of the DMD 10 and the microlenses that correspond thereto (below referred to as "mispositioning of the beams") can be detected. If an offset amount in the X direction is ΔX and an offset amount in the Y direction is ΔY, then, using the values of the output signals $P_1$, $P_2$, $P_3$ and $P_4$, ΔX and ΔY are represented by the following equations. In these equations, k and k' are constants.

$$\Delta X = k \frac{P_1 + P_3 - (P_2 + P_4)}{P_1 + P_2 + P_3 + P_4} \quad \text{Equation 1}$$

$$\Delta Y = k' \frac{P_1 + P_2 - (P_3 + P_4)}{P_1 + P_2 + P_3 + P_4}$$

Correction of Mispositioning of the Beams

Figure 5:
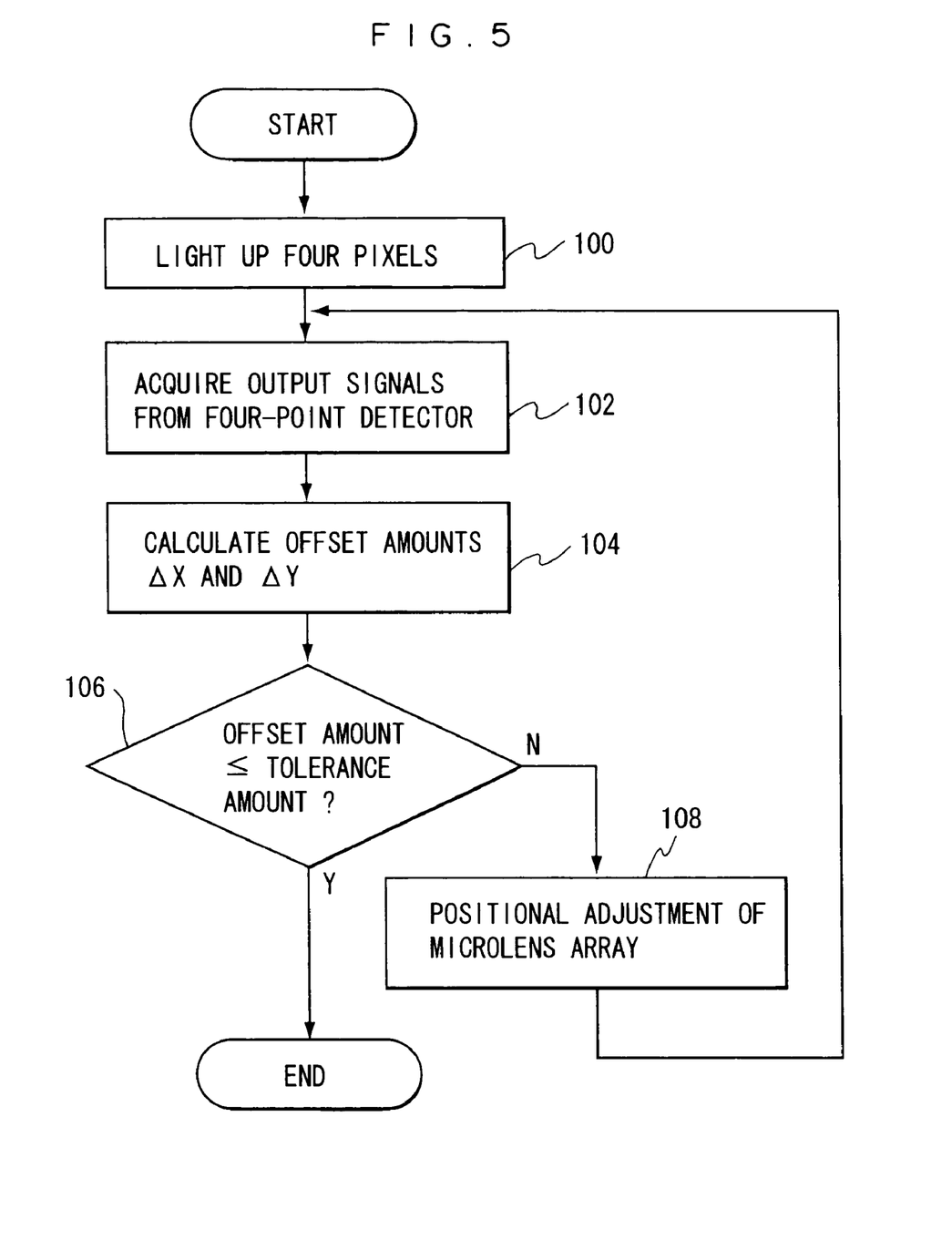
FIG. 5 is a flowchart showing a control routine when correction of mispositioning of a beam is carried out.

Next, correction of mispositioning of the beams will be described. FIG. 5 shows a control routine of the controller 30 when correction is carried out. An interrupt routine can be implemented in order to carry out detection and correction of mispositioning of the beams with a freely selected timing before commencement of exposure and/or after commencement of exposure.

In step 100, the controller 30 lights up the four modulation elements of the DMD 10 that correspond to the four pixels which are present at corner A of the exposure area 46. In step 102, the output signals $P_1$ to $P_4$ are acquired from the four-part detector 26. In step 104, the offset amount in the X direction ΔX and the offset amount in the Y direction ΔY are calculated.

In a subsequent step 106, it is judged whether or not the calculated offset amounts ΔX and ΔY are less than pre-specified tolerance amounts. If the offset amounts are not greater than the tolerance amounts, the routine finishes without carrying out correction of mispositioning of the beams. On the other hand, if the offset amounts exceed the tolerance amounts, correction of the mispositioning of the beams is carried out in step 108. In the present embodiment, the DMD 10 is fixedly disposed, so positional adjustment of the microlens array 18 is carried out, on the basis of the offset amount ΔX and the offset amount ΔY. Correction amounts in such a case are −ΔX in the X direction and −ΔY in the Y direction.

After the positional adjustment has finished, the routine returns to step 102, new output signals are acquired, and an offset amount ΔX and offset amount ΔY subsequent to the positional adjustment are calculated. Through step 106, the processing of steps 102 to 108 is repeated until the calculated offset amounts ΔX and ΔY are less than or equal to the tolerance amounts. Thus, mispositioning of the beams is eliminated, and the beams which are incident at the microlenses of the microlens array 18 from the respective modulation elements of the DMD 10 are focused at the predetermined positions of the exposure surface.

Here, instead of repeating steps 102 to 108, it is possible to just move by −ΔX and −ΔY from a start position, while monitoring contemporaneous positions of the microlens array 18 with the position detection sensor 42.

As described above, in the present embodiment, the four diodes of the four-part detector are disposed so as to correspond, respectively, to (the images of) the four modulation elements of the DMD. Thus, if there is relative mispositioning between the DMD and the microlens array, a difference is generated in the output signals of the four-art detector, and an offset of the light beams reflected from the micromirrors of the DMD and the corresponding microlenses (the mispositioning of the beams) can be detected.

Furthermore, in the present embodiment, the mispositioning of the beams is reduced by the positional correction of the microlens array being carried out repeatedly until the mispositioning of the beams is not more than the tolerance amounts. The mispositioning of the beams may be eradicated by putting the tolerance amounts for the mispositioning of the beams infinitesimally close to zero. Hence, the light beams that have been reflected at the respective micromirrors of the DMD will be properly incident at the corresponding microlenses, and the DMD images will be accurately projected to the focusing surface.

Variant Examples

Figure 6:
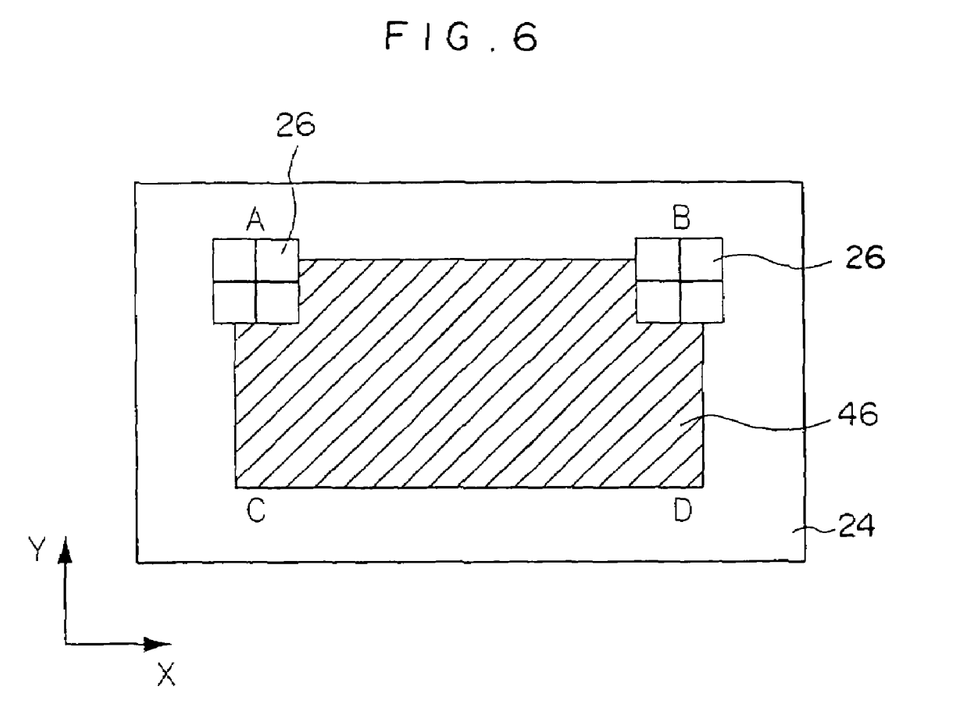
FIG. 6 is a plan view showing another arrangement of a four-part detector.

In the embodiment described above, the four-part detector 26 has been described as being disposed at at least one of the four corners A, B, C and D of the rectangular exposure area 46. However, as shown in FIG. 6 for example, the four-art detector 26 may be provided at two locations, corner A and corner B. By performing measurement at two points, mispositioning in a direction of rotation can also be detected.

For example, if offset amounts of the beams that are detected using the four-part detector 26 disposed at corner A are $\Delta X_A$ and $\Delta Y_A$, offset amounts of beams that are detected using the four-part detector 26 disposed at corner B are $\Delta X_B$ and $\Delta Y_B$, and a separation between A and B is L, then, in a case in which mispositioning of the beams over the whole of the exposure area is considered, the offset amount ΔX in the X direction, the offset amount ΔY in the Y direction and an offset amount $\theta_z$ in the rotational direction are represented by the following equations. Accordingly, in order to eliminate the mispositioning of the beams, it is possible to just move the microlens array 18 by −ΔX, −ΔY, and −$\theta_z$ from a start position.

$$\Delta X = \frac{\Delta X_A + \Delta X_B}{2} \quad \text{Equation 2}$$

$$\Delta Y = \frac{\Delta Y_A + \Delta Y_B}{2}$$

$$\theta_Z = \frac{\Delta Y_B - \Delta Y_A}{L}$$

Alternatively, the four-part detector 26 may be provided at two locations which are on a diagonal, corner A and corner D, and may be provided at each of the four corners. By providing the four-part detector 26 at two corners on a diagonal or at four corners, mispositioning of the beams over the whole exposure area can be detected, including mispositioning in the rotational direction (angular shifts), shifts in magnification and the like.

Figure 7:
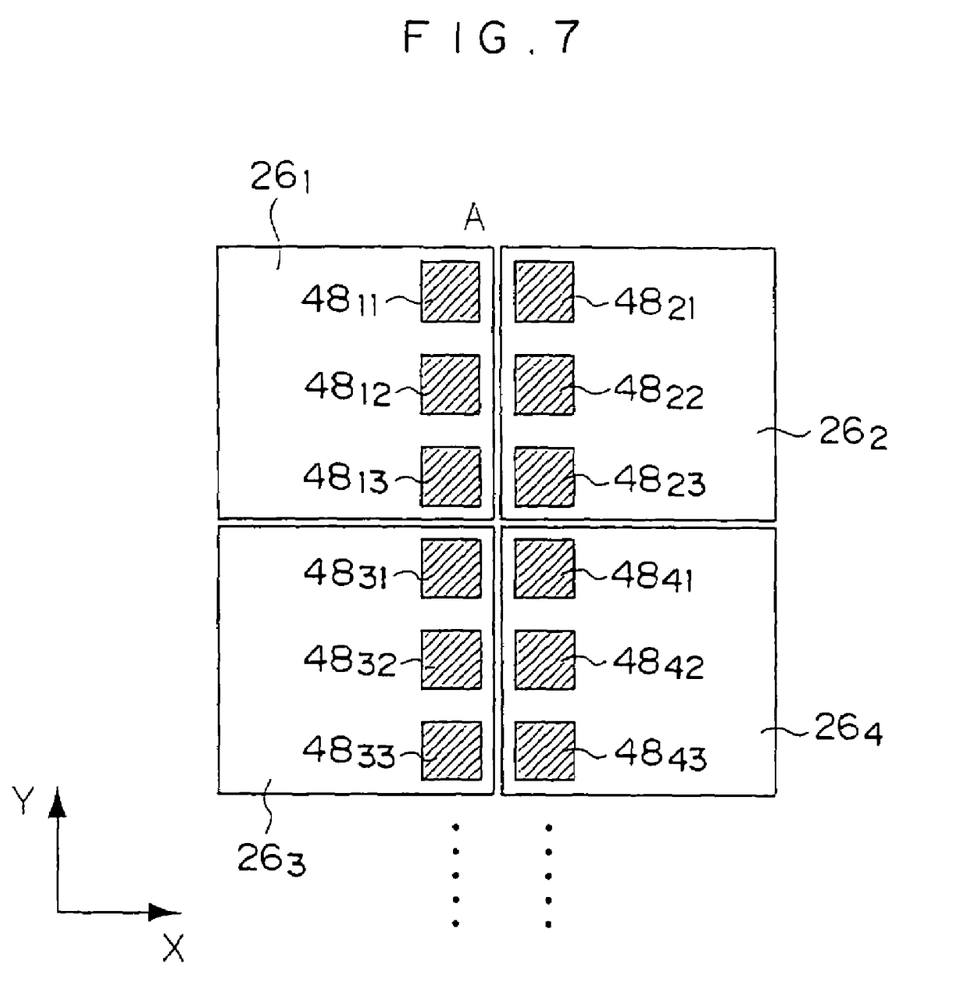
FIG. 7 is a diagram showing pixels which light up when an offset amount in an X direction and an offset amount in a Y direction are to be detected separately.

Furthermore, in the embodiment described above, an example in which the offset amount in the X direction and the offset amount in the Y direction are detected simultaneously has been described. However, the offset amount in the X direction and the offset amount in the Y direction may be detected separately. For example, as shown in FIG. 7, it is possible to light up (expose) a total of twelve pixels, two pixels in the X direction and six pixels in the Y direction, to detect an offset amount in the X direction. Each diode of the four-part detector 26 is assigned to a set of three pixels. In the example of FIG. 7, pixels $48_{11}$ to $48_{13}$ are assigned to the diode $26_1$, pixels $48_{21}$ to $48_{23}$ are allocated to the diode $26_2$, pixels $48_{31}$ to $48_{33}$ are assigned to the diode $26_3$, and pixels $48_4$, to $48_{43}$ are assigned to the diode $26_4$ Similarly, it is possible to light up a total of twelve pixels which is two pixels in the Y direction and six pixels in the X direction to detect an offset amount in the Y direction. If a one-pixel set is assigned to each diode, light amounts for the individual diodes may be insufficient, and a satisfactory accuracy of detection may not be obtained. In such cases, detection accuracy can be improved by the above-described method of increasing the number of pixels that are lit up at least in the direction in which an offset amount is to be detected. Incidentally, a two-part detector may be used in such a case.

Further, in the embodiment described above, an example in which the four-part detector is disposed at a corner of the exposure area when the stage is disposed at the reference position has been described. However, as shown by the broken lines in FIG. 8, the four-part detector 26 may be disposed outside the exposure area 46 when the stage 24 is disposed at the reference position.

Figure 8:
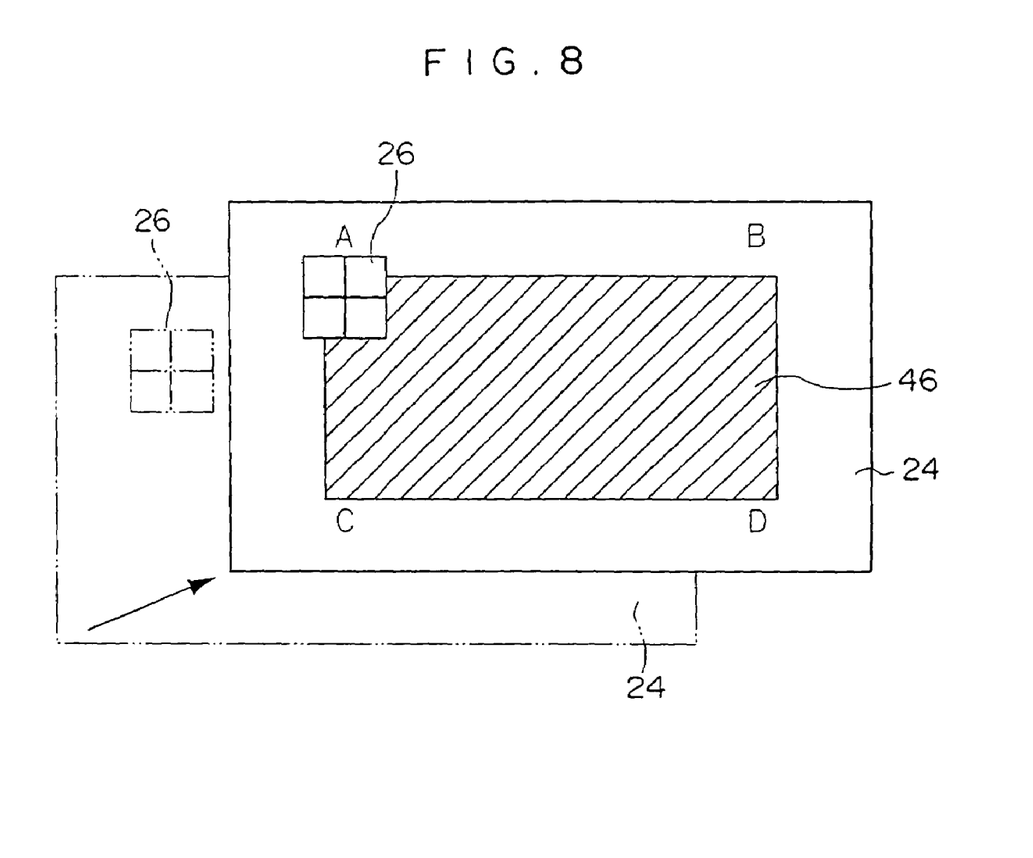
FIG. 8 is a diagram showing an example in which the four-part detector has a structure which enables insertion and withdrawal.

During detection of mispositioning of the beams, the four-part detector 26 is moved together with the stage 24, and the four-part detector 26 is disposed at a corner of the exposure area 46, as shown by the solid lines in FIG. 8. Thus, by making a structure capable of inserting and withdrawing the four-part detector 26, it is possible to respond to shrinking of the exposure area, lengthening of a cycle time and the like. However, it is necessary to move the four-part detector 26 such that gaps between the diodes do not overlap with pixels that are lit up, and it is necessary for the stage to be movable with a repeatability of tens of microns.

Alternatively, dummy pixels which are not employed for exposure may be disposed at one corner of the exposure area. Hence, mispositioning of the beams can be detected continuously.

Further still, in the embodiment described above, an example in which the position of the microlens array is adjusted to correct mispositioning of the beams has been described. However, instead of the microlens array, the position of the magnification adjustment lens may be adjusted. Moreover, the position of the DMD may be adjusted. For example, if, of these structural members, the position of a member whose sensitivity with respect to shifting of the optical axis is lower is adjusted, such that a mispositioning of 10 μm can be corrected with an optical axis movement of 2 μm, optical axis adjustment is easier. Alternatively, mispositioning of the beams may also be corrected for by inserting a parallel flat plate at the light incidence side of the microlens array, and altering inclination of this parallel flat plate.

Further yet, in the embodiment described above, an example which uses the four-part detector has been described. However, instead of the four-part detector, a two-dimensional CCD (charge coupled device), phototransistors or the like may be divided between regions and employed.

Further again, in the embodiment described above, an example in which a trimming mechanism which utilizes piezoelectric elements is employed as the trimming mechanism which adjusts the position of a lens or the like has been described. However, other trimming mechanisms may be employed. For example, other than structures which push an object of movement from three directions with piezoelectric devices such as piezo elements and the like, it is possible to employ a mechanism which uses a Peltier element and thermistors and which controls temperature to control extension/compression amounts of a retaining member for an object of movement, a mechanical mechanism which scales down movement amounts by combining an electric motor with a speed reduction mechanism, a cam or the like, or the like.

According to an exposure device of the present invention, there is an effect that it is possible to accurately project an image of a spatial light modulation device at a focusing plane.

What is claimed is:

1. An exposure device comprising:
    a light source which emits a light beam for exposure;
    a spatial light modulation device at which a plurality of modulation elements, which respectively change light modulation states thereof in accordance with control signals, are two-dimensionally arranged, the spatial light modulation device being for modulating the light beam, which is incident at the plurality of modulation elements from the light source, at each of the modulation elements;
    a microlens array at which a plurality of microlenses are two-dimensionally arranged with a pitch corresponding to the plurality of modulation elements, the microlens array being for condensing light beams, which have been modulated by the modulation elements, at the respective microlenses;
    a shift amount detection section for detecting an offset amount of relative positions of the light beams which have been modulated by the modulation elements and the corresponding microlenses; and
    a position adjustment section which finely adjusts position of at least one of the spatial light modulation device and the microlens array on the basis of the detected offset amount.

2. The exposure device of claim 1, wherein the position adjustment section finely adjusts the position of the at least one of the spatial light modulation device and the microlens array on the basis of the detected offset amount such that the offset amount is reduced.

3. The exposure device of claim 1, wherein the position adjustment section finely adjusts the position of the at least one of the spatial light modulation device and the microlens array such that the offset amount of the relative positions of the light beams which have been modulated by the modulation elements and the corresponding microlenses, which is detected at the shift amount detection section, is not more than a predetermined value.

4. The exposure device of claim 1, wherein the shift amount detection section comprises: a plurality of light detection elements which correspond, respectively, to a mutually adjacent plurality of the modulation elements; and a calculation section which calculates, on the basis of detection signals from the plurality of light detection elements, the offset amount of the light beams which have been modulated by the modulation elements and the corresponding microlenses.

5. The exposure device of claim 4, wherein the light detection elements comprise photodiodes.

6. The exposure device of claim 1, wherein the shift amount detection section comprises a four-part detector which includes: four photodiodes which correspond, respectively, to four of the modulation elements, which are arranged in a matrix form; and a calculation section which calculates, on the basis of detection signals from the four photodiodes, a row direction offset amount and a column direction offset amount of the microlenses corresponding to the light beams which have been modulated by the modulation elements.

7. The exposure device of claim 1, wherein the position adjustment section comprises a trimming mechanism which utilizes piezoelectric elements.

8. An exposure device comprising:
a light source which emits a light beam for exposure;
a spatial light modulation device at which a plurality of modulation elements, which respectively change light modulation states thereof in accordance with control signals, are two-dimensionally arranged, the spatial light modulation device being for modulating the light beam, which is incident at the plurality of modulation elements from the light source, at each of the modulation elements;
a microlens array at which a plurality of microlenses are two-dimensionally arranged with a pitch corresponding to the plurality of modulation elements, the microlens array being for condensing light beams, which have been modulated by the modulation elements, at the respective microlenses;
a focusing optical system including at least one optical member, the focusing optical system being for focusing the light beams which have been modulated by the modulation elements so as to correspond to the microlenses;
a shift amount detection section which detects an offset amount of relative positions of the light beams which have been modulated by the modulation elements and the corresponding microlenses; and
a position adjustment section which finely adjusts position of at least one of the spatial light modulation device, the microlens array and the optical member on the basis of the detected offset amount.

9. The exposure device of claim 8, wherein the position adjustment section finely adjusts the position of the at least one of the spatial light modulation device, the microlens array and the optical member on the basis of the detected offset amount such that the offset amount is reduced.

10. The exposure device of claim 8, wherein the position adjustment section finely adjusts the position of the at least one of the spatial light modulation device, the microlens array and the optical member such that the offset amount of the relative positions of the light beams which have been modulated by the modulation elements and the corresponding microlenses, which is detected at the shift amount detection section, is not more than a predetermined value.

11. The exposure device of claim 8, wherein the shift amount detection section comprises: a plurality of light detection elements which correspond, respectively, to a mutually adjacent plurality of the modulation elements; and a calculation section which calculates, on the basis of detection signals from the plurality of light detection elements, the offset amount of the light beams which have been modulated by the modulation elements and the corresponding microlenses.

12. The exposure device of claim 11, wherein the light detection elements comprise photodiodes.

13. The exposure device of claim 8, wherein the shift amount detection section comprises a four-part detector which includes: four photodiodes which correspond, respectively, to four of the modulation elements, which are arranged in a matrix form; and a calculation section which calculates, on the basis of detection signals from the four photodiodes, a row direction offset amount and a column direction offset amount of the microlenses corresponding to the light beams which have been modulated by the modulation elements.

14. The exposure device of claim 8, wherein the position adjustment section comprises a trimming mechanism which utilizes piezoelectric elements.

15. An exposure device comprising:
a light source which emits a light beam;
a spatial light modulation device including a plurality of unit elements which are arranged two-dimensionally, the spatial light modulation device being for modulating the light beam, which is incident at the plurality of unit elements, at each of the unit elements in accordance with control signals which are inputted to the spatial light modulation device;
a microlens array including microlenses which are arranged to correspond to the plurality of unit elements and which respectively condense light beams, which have been modulated by the unit elements;
a displacement detection section for detecting displacement of a relative position of at least one of the plurality of unit elements and at least one of the plurality of microlenses corresponding to the at least one unit element from a predetermined relative position; and
a position adjustment section which finely adjusts position of at least one of the spatial light modulation device and the microlens array on the basis of the detected displacement.

16. The exposure device of claim 15, wherein the displacement detection section detects the displacement by detecting light beams that have been modulated by, of the plurality of unit elements, at least two neighboring unit elements and have passed through the microlenses that correspond to those unit elements, and comparing outputs of detected light beams.

17. The exposure device of claim 15, wherein the displacement detection section detects displacement of a relative position of a light beam that has been modulated by at least one of the plurality of unit elements and at least one of the plurality of microlenses corresponding to the at least one unit element from a predetermined relative position.

18. The exposure device of claim 15, wherein the position adjustment section comprises a trimming mechanism which utilizes piezoelectric elements.

19. The exposure device of claim 15, wherein the plurality of unit elements respectively include micromirrors which change angles of reflection surfaces thereof with respect to the incident light beam in accordance with the control signals which are inputted to the spatial light modulation device.

* * * * *